United States Patent
Jiang et al.

(10) Patent No.: US 9,069,205 B2
(45) Date of Patent: Jun. 30, 2015

(54) TOUCH DISPLAY SCREEN, METHOD FOR MANUFACTURING DISPLAY ELECTRODE OF THE TOUCH DISPLAY SCREEN, DISPLAY ELECTRODE AND ELECTRONIC DEVICE

(71) Applicant: FocalTech Systems, Ltd., George Town, Grand Cayman (KY)

(72) Inventors: Xinxi Jiang, Guangdong (CN); Lianghua Mo, Guangdong (CN); Hua Li, Guangdong (CN); Peng Wang, Guangdong (CN)

(73) Assignee: FOCALTECH SYSTEMS, LTD., George Town, Grand Cayman (KY)

( * ) Notice: Subject to any disclaimer, the term of this patent is extended or adjusted under 35 U.S.C. 154(b) by 0 days.

(21) Appl. No.: 13/942,495

(22) Filed: Jul. 15, 2013

(65) Prior Publication Data
US 2014/0204287 A1    Jul. 24, 2014

(30) Foreign Application Priority Data
Jan. 18, 2013    (CN) .......................... 2013 1 0019555

(51) Int. Cl.
G02F 1/1333    (2006.01)
G06F 3/041    (2006.01)
G06F 3/044    (2006.01)
H01L 27/12    (2006.01)

(52) U.S. Cl.
CPC ............ *G02F 1/13338* (2013.01); *H01L 27/124* (2013.01); *G06F 3/0412* (2013.01); *G06F 3/044* (2013.01)

(58) Field of Classification Search
CPC .......................... G02F 1/13338; G06F 3/0412
USPC .......................................................... 349/12
See application file for complete search history.

(56) References Cited

U.S. PATENT DOCUMENTS

2012/0062104 A1    3/2012    Kwack et al.
2012/0162104 A1*    6/2012    Chang et al. .................. 345/173

FOREIGN PATENT DOCUMENTS

| CN | 101017419 | 8/2007 |
| CN | 102768604 | 11/2012 |
| CN | 102841718 | 12/2012 |

OTHER PUBLICATIONS

Application No. 201310019555.6, mailed Feb. 28, 2015, Chinese Office Action and Partial English Translation.

* cited by examiner

*Primary Examiner* — Phu Vu
(74) *Attorney, Agent, or Firm* — Workman Nydegger

(57) ABSTRACT

A touch display screen, a method for manufacturing a display electrode of the touch display screen, a display electrode and an electronic device are described. In the touch display screen, the electrode in the first direction and the electrode in the second direction are connected to the touch detecting unit, and the touch detecting unit and the display control unit operate in a time-sharing manner. Thus, a part of the display electrode can be multiplexed, and it is unnecessary to provide an additional touch-sensitive layer to detect the touch on the touch display screen, so the structure of the touch display screen is simplified; because the touch-sensitive layer is omitted, the touch display screen has better transmittance; and because the touch detecting unit and the display control unit operate in a time-sharing manner, the detection on the touch and the control on the display will not affect mutually.

18 Claims, 6 Drawing Sheets

TOUCH DISPLAY SCREEN, METHOD FOR MANUFACTURING DISPLAY ELECTRODE OF THE TOUCH DISPLAY SCREEN, DISPLAY ELECTRODE AND ELECTRONIC DEVICE

CROSS REFERENCE TO RELATED APPLICATION

This application claims the benefit of priority to Chinese Patent Application No.201310019555.6, entitled "TOUCH DISPLAY SCREEN, METHOD FOR MANUFACTURING DISPLAY ELECTRODE OF THE TOUCH DISPLAY SCREEN, DISPLAY ELECTRODE AND ELECTRONIC DEVICE", filed on Jan. 18, 2013 with State Intellectual Property Office of PRC, which is incorporated herein by reference in its entirety.

FIELD OF THE INVENTION

The invention relates to the technical field of electronic device, and in particular to a touch display screen, a method for manufacturing a display electrode of the touch display screen, a display electrode and an electronic device.

BACKGROUND OF THE INVENTION

With the development of the touch display technology, capacitive touch display screens are more and more widely used. The touch display screen of an existing electronic device generally includes a display layer and a touch-sensitive layer, where the display layer includes electrodes adapted to implement liquid crystal display, such as pixel electrodes, common electrodes and Thin Film Transistors (TFTs), and the touch-sensitive layer includes electrodes adapted to detect the touch on the touch display screen. Generally, the touch-sensitive layer and the display layer are stacked from top (the direction of the external surface of the electronic device) to bottom in the touch display screen, so as to realize the function of touch display.

SUMMARY OF THE INVENTION

A touch display screen, a method for manufacturing a display electrode of the touch display screen, a display electrode and an electronic device are provided according to embodiments of the invention, for simplifying the structure of the touch display screen.

A touch display screen is provided according to an embodiment of the invention, and the touch display screen includes a cover plate, a color filter, a liquid crystal layer, a display electrode, a substrate and a backlight unit which are stacked sequentially from top to bottom, wherein the touch display screen further includes a touch detecting unit and a display control unit;

wherein the display electrode includes an electrode in a first direction and an electrode in a second direction which intersects with the first direction;

the electrode in the first direction and the electrode in the second direction are connected to the touch detecting unit, the touch detecting unit is adapted to detect the mutual capacitance formed between the electrode in the first direction and the electrode in the second direction, and determine touch on the touch display screen based on the detected mutual capacitance;

the display electrode is further connected to the display control unit, the display control unit is adapted to control the display electrode to perform liquid crystal display; and the display control unit and the touch detecting unit operate in a time-sharing manner.

An electronic device is further provided according to an embodiment of the invention, and the electronic device includes a touch display screen;

the touch display screen includes a cover plate, a color filter, a liquid crystal layer, a display electrode, a substrate and a backlight unit which are stacked sequentially from top to bottom, wherein the touch display screen further includes a touch detecting unit and a display control unit;

wherein the display electrode includes an electrode in a first direction and an electrode in a second direction which intersects with the first direction;

the electrode in the first direction and the electrode in the second direction are connected to the touch detecting unit, the touch detecting unit is adapted to detect the mutual capacitance formed between the electrode in the first direction and the electrode in the second direction, and determine touch on the touch display screen based on the detected mutual capacitance;

the display electrode is further connected to the display control unit, the display control unit is adapted to control the display electrode to perform liquid crystal display; and the display control unit and the touch detecting unit operate in a time-sharing manner.

According to the embodiment of the invention, in the display electrode of the touch display screen, the electrode in the first direction and the electrode in the second direction are connected to the touch detecting unit, and the touch detecting unit and the display control unit operate in a time-sharing manner. Thus, a part of the display electrode can be multiplexed as the electrodes to detect the touch on the touch display screen, it is unnecessary to provide an additional touch-sensitive layer to detect the touch on the touch display screen, and the structure of the touch display screen is simplified; furthermore, because the touch-sensitive layer is omitted, the touch display screen has better transmittance; and because the touch detecting unit and the display control unit operate in a time-sharing manner, the detection on the touch and the control on the display will not affect mutually.

BRIEF DESCRIPTION OF THE DRAWINGS

In order to illustrate the technical solutions according to the embodiments of the present invention or in the prior art more clearly, drawings to be used in the description of the prior art or the embodiments will be described briefly hereinafter. Apparently, the drawings described hereinafter are only some embodiments of the present invention, and other drawings may be obtained by those skilled in the art according to those drawings without inventive efforts.

DETAILED DESCRIPTION OF THE INVENTION

Hereinafter, the technical solution in the embodiment of the present invention will be described clearly and completely in conjunction with the drawings in the embodiment of the present invention. Obviously, the described embodiments are only some of the embodiments of the present invention, but not all the embodiments. All the other embodiments obtained by those skilled in the art based on the embodiments in the present invention without creative efforts fall within the scope of protection of the present invention.

Figure 1:
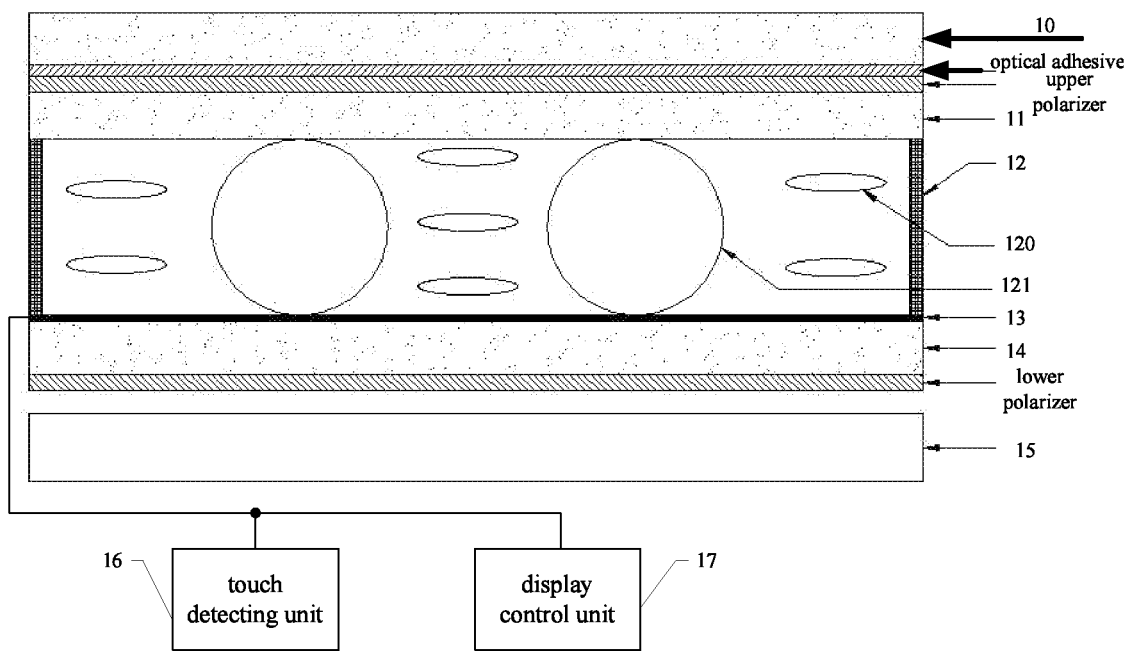
FIG. 1 is a schematic structural diagram of a touch display screen according to an embodiment of the invention.

A touch display screen (i.e., a liquid crystal screen having a function of touch-control) is provided according to an embodiment of the invention, and the touch display screen generally refers to a In-Plane Switching (IPS) liquid crystal display screen, in which all the display electrodes adapted to implement the liquid crystal display are in the same layer. This type of liquid crystal display screen is generally adapted to be used in an electronic device. The liquid crystal display screen has a structure as shown in FIG. 1. The liquid crystal display screen includes:

a cover plate 10, a color filter 11, a liquid crystal layer, a display electrode 13, a substrate 14 and a backlight unit 15 which are stacked sequentially from top to bottom, where the touch display screen further includes a touch detecting unit 16 and a display control unit 17, where the direction of the external surface of the electronic device is defined as the top-direction, and the internal surface of the electronic device is defined as the bottom-direction.

Specifically, in order to convert the circularly polarized light into the linearly polarized light, so as to realize the liquid crystal display, it is necessary to provide a polarizer on the color filter 11 and a polarizer under the substrate 14. Specifically, an upper polarizer is disposed between the cover plate 10 and the color filter 11. The upper polarizer can be bonded to the internal surface of the cover plate 10 by a transparent optical adhesive. A lower polarizer is disposed between the backlight unit 15 and the substrate 14.

The color filter 11 enables the touch display screen to display a color picture. The color filter 11 generally includes a red filtering region, a blue filtering region and a green filtering region. The liquid crystal layer includes liquid crystal molecules 120 and spacing particles 121 which both can be disposed between the color filter 11 and the display electrode 13 by means of a sealant 12. The spacing particles 121 can support the color filter 11, for preventing the color filter 11 from being deformed, and provide a liquid crystal rotating space. The sealant 12 is adopted to bond the color filter 11 and the substrate 14, for forming a sealed space. The display electrode 13, which is the electrode adapted to realize the liquid crystal display and can have a structure shown in FIG. 2, includes a signal electrode, a Thin Film Transistor (TFT), a switch electrode, a pixel electrode, a common electrode in an X-axis direction and a common electrode in a Y-axis direction. The display electrode 13 can be made of Indium Tin Oxide (ITO), and may have good transparence and conductibility.

The electrode 130 in the first direction and the electrode 131 in the second direction are both connected to the touch detecting unit 16. The touch detecting unit 16 is adapted to detect the mutual capacitance 132 formed between the electrode 130 in the first direction and the electrode 131 in the second direction, and determine the touch on the touch display screen based on the detected mutual capacitance 132. The display electrode 13 is further connected to the display control unit 17. The display control unit 17 is adapted to control the display electrode to perform liquid crystal display. In this embodiment, the touch detecting unit 16 and the display control unit 17 can operate in accordance with a predetermined setting in a time-sharing manner; and in another embodiment, it is necessary to provide an extra control unit which is connected to the touch detecting unit 16 and the display control unit 17 and controls the touch detecting unit 16 and the display control unit 17 to operate in a time-sharing manner. For example, when the display control unit 17 is controlling the display, the touch detecting unit 16 stops detecting the touch on the touch display screen.

Figure 2:
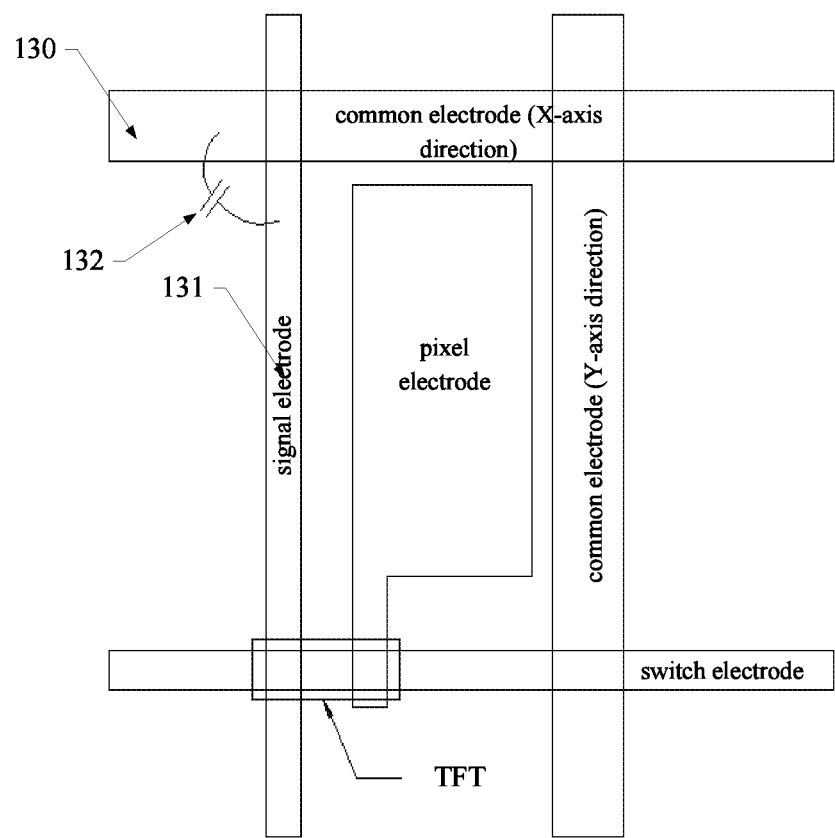
FIG. 2 is a schematic diagram of a display electrode when a touch detecting unit operates according to an embodiment of the invention.

In this embodiment, as shown in FIG. 2, the display electrode includes the common electrode in the X-axis direction, the common electrode in the Y-axis direction, the signal electrode and the pixel electrode, where the pixel electrode is connected to the signal electrode via the switch electrode and the TFT. When being in the operation state, the display control unit 17 can control the TFT to be turned off by the switch electrode. When the TFT is in the turned off state, the TFT is equivalent to two diodes connected reversely, the current in the signal electrode can not flow through the TFT to the drain; and since the pixel electrode is connected to the drain of the TFT, the current in the signal electrode can not flow to the pixel electrode, thus no electric filed can be built between the pixel electrode and the common electrode. Hence, the lights from the backlight unit 15 can not arrive at the upper polarizer after arrive at the layer of the display electrode 13 via the lower polarizer, and the touch display screen is in black. The display control unit 17 can also control the TFT to be turned on, the current in the signal electrode flows through the TFT to the drain, an electric field is built between the pixel electrode and the common electrode, and the liquid crystal molecules 120 above the display electrode 130 rotate under the action of the electric field, so that the lights from the backlight unit 15 finally arrive at the cover plate 10 via the upper polarizer due to the rotation of the liquid crystal molecules 120, after arrives at the layer of the display electrode 13 via the lower polarizer. In addition to the above operating mode, there are other modes in which the display control electrode 17 controls the display electrode to perform the liquid crystal display, which will not be described in detail here.

Figure 3:
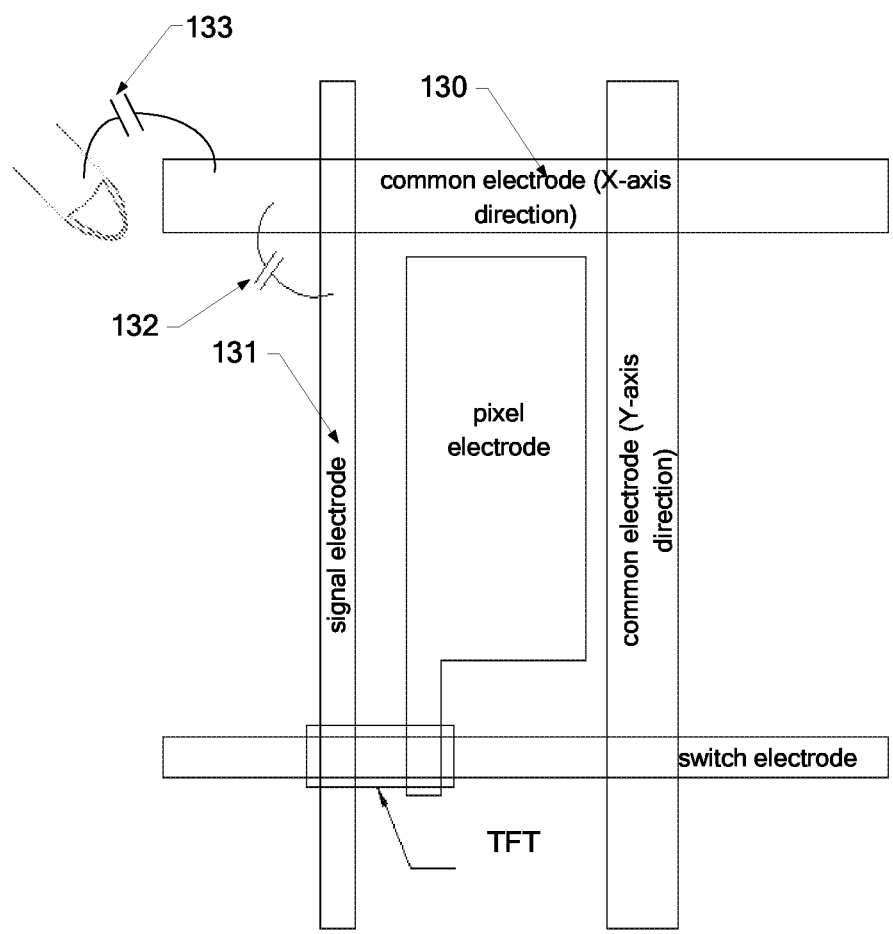
FIG. 3 is a schematic diagram of a display electrode when a touch display screen is touched by a touching object according to an embodiment of the invention.

Referring to FIG. 2 and FIG. 3, when the touch detecting unit 16 is in the operating mode, the electrode 130 in the first direction of the display electrode 13 can serve as the driving electrode, and the electrode 131 in the second direction of the display electrode 13 can serve as the receiving electrode. When the touch display screen is not touched by any touching object, the touch detecting unit 16 detects the mutual capacitor 132 in the value of Cm1 formed between the driving electrode and the receiving electrode; and when the touch display screen is touched by a touching object, a capacitor 133 in the value of Cf will be formed between the touching object and the driving electrode, thus a part of the signal of the driving electrode is absorbed by the touching object, and the touch detecting unit 16 will detect that the mutual capacitor 132 formed between the driving electrode and the receiving electrode becomes a smaller value of Cm2. It can be seen that the touch detecting unit 16 can determine whether the touch display screen is touched by a touching object by detecting the mutual capacitance formed between the driving electrode and the receiving electrode, and can calculate the position of the touch made by the touching object using a corresponding algorithm.

For the electrode 130 in the first direction and the electrode 131 in the second direction, the first direction intersects with the second direction at an angle including but not limited to 90°. Specifically, the electrode 130 in the first direction can be the common electrode in the X-axis direction, and the electrode 131 in the second direction can be the signal electrode; or the electrode 130 in the first direction can be the switch electrode, and the electrode 131 in the second direction can be the common electrode in the Y-axis direction; or the electrode 130 in the first direction can be the common electrode in the X-axis direction, and the electrode 131 in the second direction can be the common electrode in the Y-axis direction.

It can be seen that according to the embodiment of the invention, in the touch display screen, the electrode in the first direction and the electrode in the second direction included in the display electrode can be both connected to the touch detecting unit, and the touch detecting unit and the display control unit operate in a time-sharing manner. Thus, a part of the display electrode can be multiplexed as the electrodes which are adapted to detect the touch on the touch display screen, and it is unnecessary to provide an additional touch-sensitive layer which is adapted to detect the touch on the touch display screen, so the structure of the touch display screen is simplified; furthermore, because the touch-sensitive layer is omitted, the touch display screen has better transmittance; and because the touch detecting unit and the display control unit operate in a time-sharing manner, the detection on the touch and the control on the display will not affect mutually.

Figure 4:
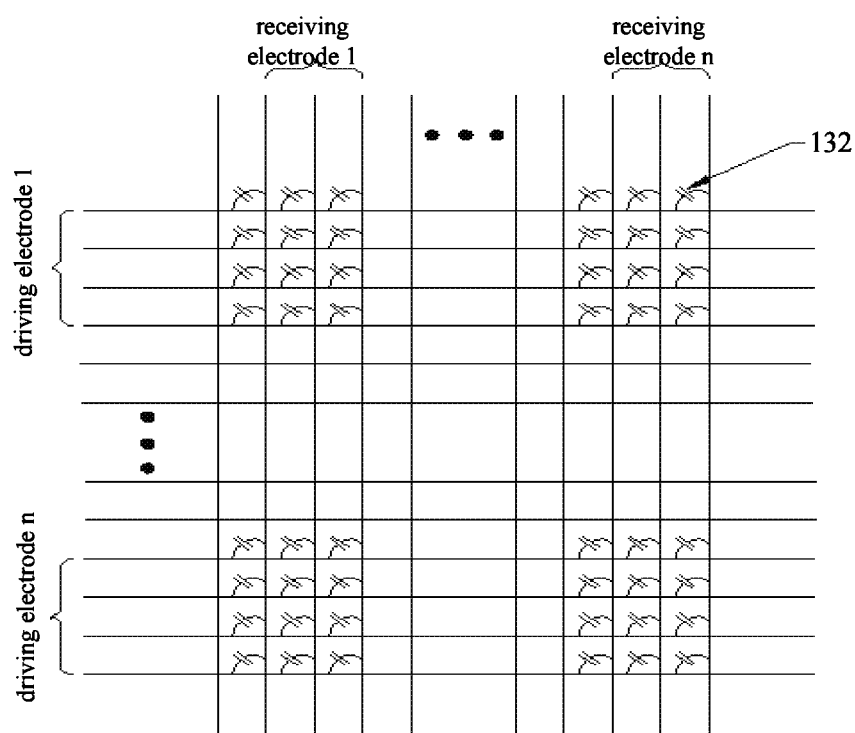
FIG. 4 is a schematic diagram showing that a part of a display electrode serves as driving electrodes and receiving electrodes according to an embodiment of the invention.

Referring to FIG. 4, it is to be noted that when the electrode 130 in the first direction and the electrode 131 in the second direction of the display electrode described above serve as the electrodes used when the touch detecting unit 16 performs the touch detection, multiple electrodes 130 in the first direction can be served collectively as one driving electrode, and multiple electrodes 131 in the second direction can be served collectively as one receiving electrode; or similarly, multiple electrodes 130 in the first direction can be served collectively as one receiving electrode, and multiple electrodes 131 in the second direction can be served collectively as one driving electrode.

Figure 5:
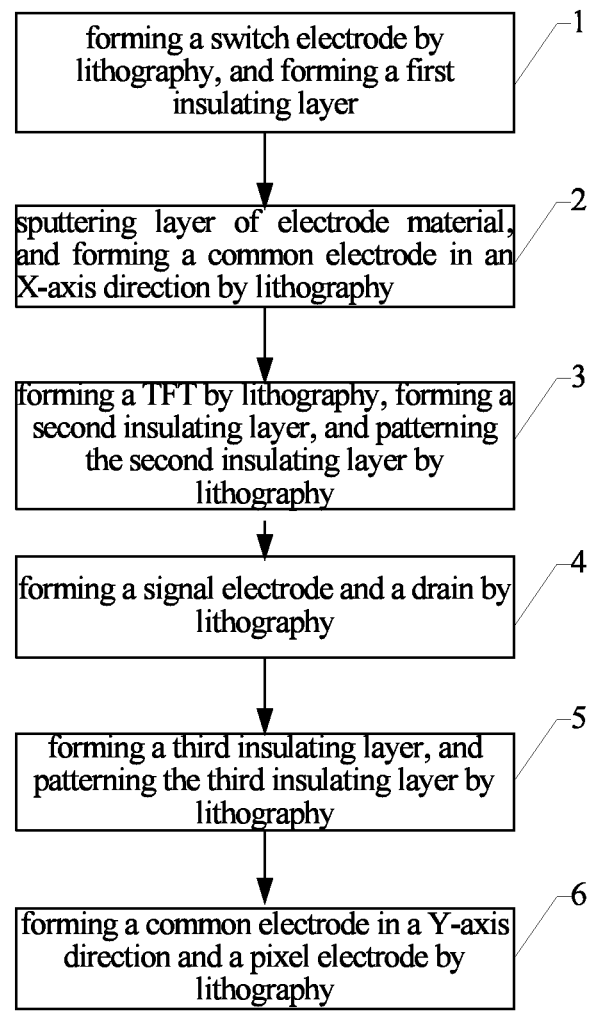
FIG. 5 is a flow chart of a method for manufacturing a display electrode of a touch display screen according to an embodiment of the invention.

A method for manufacturing the display electrode 13 of the touch display screen described above is further provided according to an embodiment of the invention, and the method includes the following steps 1 to 6, as shown in FIG. 5.

Step 1, vacuum sputtering a layer of metal, such as molybdenum, aluminum or neodymium, on a substrate 14, patterning the layer of metal by lithography to form a switch electrode, and forming a first insulating layer 1 on the switch electrode. Specifically, the first insulating layer 1 can be formed by a plasma enhanced chemical vapor deposition, for protecting the switch electrode. Specifically, the first insulating layer 1 can be formed as an integral plane, or can only be formed in the position corresponding to the switch electrode.

Step 2, vacuum sputtering a layer of electrode material, such as ITO, on the first insulating layer, and patterning the layer of electrode material by lithography to form a common electrode in an X-axis direction.

Step 3, forming a pattern of Thin Film Transistor (TFT) by lithography, for example by the plasma enhanced chemical vapor deposition, forming a second insulating layer 2 on the TFT and the common electrode in the X-axis direction for example by the plasma enhanced chemical vapor deposition, and patterning the second insulating layer 2 by lithography. Specifically, when the second insulating layer 2 is patterned by lithography, holes can be made in the second insulating layer 2 at positions corresponding to the pattern of the TFT, so that the drain and the signal input terminal of the TFT are exposed. The second insulating layer 2 can be formed as an integral plane, or can only be formed at the corresponding position on the TFT and the common electrode in the X-axis direction.

Step 4, vacuum sputtering a layer of metal, such as molybdenum, aluminum or neodymium, on the second insulating layer 2, and patterning the layer of metal by lithography to form a signal electrode and a drain in a way that the signal electrode and the drain are connected to two terminals of the TFT, i.e., the input terminal and the drain of the TFT, respectively, via the patterned second insulating layer 2.

Step 5, forming a third insulating layer 3 on the signal electrode and the drain for example by the plasma enhanced chemical vapor deposition, and patterning the third insulating layer 3 by lithography. Specifically, when the third insulating layer 3 is patterned by lithography, holes can be made in the third insulating layer 3 at positions corresponding to the drain, so that the drain is exposed. The third insulating layer 3 can be formed as an integral plane, or can only be formed in the corresponding position on the signal electrode and the drain.

Step 6, vacuum sputtering a layer of electrode material, such as ITO, on the third insulating layer 3, and patterning the layer of electrode material by lithography to form a common electrode in a Y-axis direction and a pixel electrode in a way that the pixel electrode is connected to the drain via the patterned third insulating layer.

Figure 6:
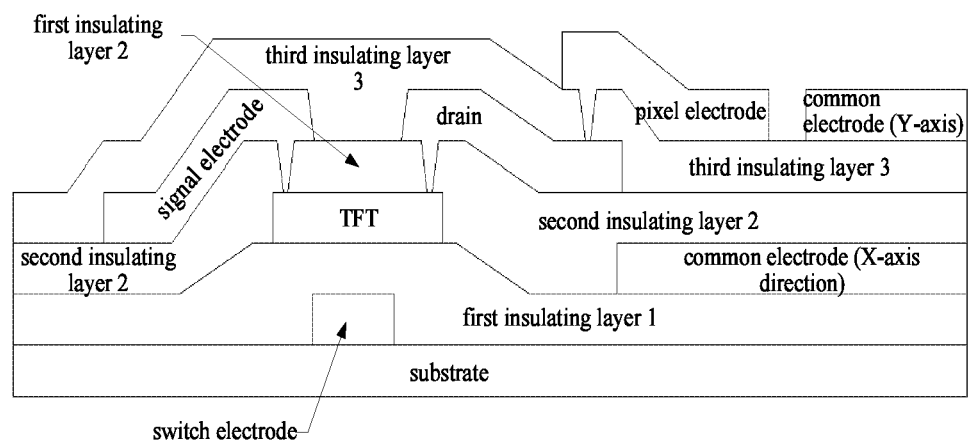
FIG. 6 is diagram showing a stacked structure of a display electrode of a touch display screen according to an embodiment of the invention.

By the step 1 to step 6, the display electrode having the structure as shown in FIG. 6 can be formed, and the display electrode includes: a switch electrode, a pixel electrode, a Thin Film Transistor (TFT), a signal electrode, a common electrode in an X-axis direction and a common electrode in a Y-axis direction, where:

a first insulating layer 1 is stacked above the switch electrode, the TFT and the common electrode in the X-axis direction are stacked above the first insulating layer 1;

a second insulating layer 2 is stacked above the TFT and the common electrode in the X-axis direction, the signal electrode and a drain are stacked above the second insulating layer 2, and the signal electrode and the drain are connected to two terminals (i.e., the signal input terminal and the drain) of the TFT respectively by passing through the second insulating layer 2; and a third insulating layer 3 is stacked above the signal electrode and the drain, the pixel electrode is stacked on the third insulating layer 3, and the pixel electrode is connected to the drain by passing through the third insulating layer 3.

An electronic device is further provided according to an embodiment of the invention, and the electronic device includes a touch display screen which has a structure as that of the touch display screen described above, which will not be described in detail here.

In the above, the touch display screen, the method for manufacturing the display electrode of the touch display screen, the display electrode and the electronic device have been described in detail. Embodiments are set fort to describe the principle and application of the invention. The description of the above embodiments is only to facilitate understanding the method of the invention and the core idea of the method, and variations can be made by those skilled in the art in light of the invention. In total, the content of the specification should not be interpreted as to limit the invention.

The invention claimed is:

1. A touch display screen, comprising a cover plate, a color filter, a liquid crystal layer, a display electrode, a substrate and a backlight unit which are stacked sequentially from top to bottom, wherein:

the touch display screen further comprises a touch detecting unit and a display control unit;

the display electrode comprises an electrode in a first direction and an electrode in a second direction which intersects with the first direction;

the electrode in the first direction and the electrode in the second direction are connected to the touch detecting unit, the touch detecting unit is adapted to detect mutual capacitance formed between the electrode in the first direction and the electrode in the second direction, and determine a touch on the touch display screen based on the detected mutual capacitance;

the display electrode is further connected to the display control unit, the display control unit is adapted to control the display electrode to perform liquid crystal display; and the display control unit and the touch detecting unit operate in a time-sharing manner.

2. The touch display screen according to claim 1, further comprising a control unit, which is connected to both the display control unit and the touch detecting unit for controlling the display control unit and the touch detecting unit to operate in the time-sharing manner.

3. The touch display screen according to claim 1, wherein:

the electrode in the first direction comprises a common electrode in an X-axis direction, and the electrode in the second direction comprises a signal electrode; or the electrode in the first direction comprises a switch electrode, and the electrode in the second direction comprises a common electrode in a Y-axis direction; or the electrode in the first direction comprises a common electrode in an X-axis direction, and the electrode in the second direction comprises a common electrode in a Y-axis direction.

4. The touch display screen according to claim 1, wherein:

a plurality of electrodes in the first direction are served collectively as one driving electrode which is adapted to be used when the touch detecting unit performs the touch detection, and a plurality of electrodes in the second direction are served collectively as one receiving electrode which is adapted to be used when the touch detecting unit performs the touch detection; or a plurality of electrodes in the first direction are served collectively as one receiving electrode which is adapted to be used when the touch detecting unit performs the touch detection, and a plurality of electrodes in the second direction are served collectively as one driving electrode which is adapted to be used when the touch detecting unit performs the touch detection.

5. An electronic device, comprising a touch display screen, the touch display screen comprising: a cover plate, a color filter, a liquid crystal layer, a display electrode, a substrate and a backlight unit which are stacked sequentially from top to bottom, wherein:

the touch display screen further comprises a touch detecting unit and a display control unit;

the display electrode comprises an electrode in a first direction and an electrode in a second direction which intersects with the first direction;

the electrode in the first direction and the electrode in the second direction are connected to the touch detecting unit, the touch detecting unit is adapted to detect mutual capacitance formed between the electrode in the first direction and the electrode in the second direction, and determine a touch on the touch display screen based on the detected mutual capacitance;

the display electrode is further connected to the display control unit, the display control unit is adapted to control the display electrode to perform liquid crystal display; and the display control unit and the touch detecting unit operate in a time-sharing manner.

6. A method for manufacturing a display electrode, comprising:

vacuum sputtering a layer of metal on a substrate of a touch display screen, patterning the layer of metal by lithography to form a switch electrode, and forming a first insulating layer on the switch electrode;

vacuum sputtering a layer of electrode material, and patterning the layer of electrode material by lithography to form a common electrode in an X-axis direction;

forming a Thin Film Transistor TFT by lithography, forming a second insulating layer on the TFT and the common electrode in the X-axis direction, and patterning the second insulating layer by lithography;

vacuum sputtering a layer of metal, and patterning the layer of metal by lithography to form a signal electrode and a drain in a way that the signal electrode and the drain are connected to two terminals of the TFT respectively via the patterned second insulating layer;

forming a third insulating layer on the signal electrode and the drain, and patterning the third insulating layer by lithography; and vacuum sputtering a layer of electrode material, and patterning the layer of electrode material by lithography to form a common electrode in a Y-axis direction and a pixel electrode in a way that the pixel electrode is connected to the drain via the patterned third insulating layer.

7. A display electrode of a touch display screen, comprising a switch electrode, a pixel electrode, a Thin Film Transistor TFT, a signal electrode, a common electrode in an X-axis direction and a common electrode in a Y-axis direction, wherein:

a first insulating layer is stacked above the switch electrode, the TFT and the common electrode in the X-axis direction are stacked on the first insulating layer;

a second insulating layer is stacked above the TFT and the common electrode in the X-axis direction, the signal electrode and a drain are stacked on the second insulating layer, and the signal electrode and the drain are respectively connected to two terminals of the TFT by passing through the second insulating layer; and a third insulating layer is stacked above the signal electrode and the drain, the pixel electrode is stacked on the third insulating layer, and the pixel electrode is connected to the drain by passing through the third insulating layer.

8. The touch display screen according to claim 2, wherein:

the electrode in the first direction comprises a common electrode in an X-axis direction, and the electrode in the second direction comprises a signal electrode; or the electrode in the first direction comprises a switch electrode, and the electrode in the second direction comprises a common electrode in a Y-axis direction; or the electrode in the first direction comprises a common electrode in an X-axis direction, and the electrode in the second direction comprises a common electrode in a Y-axis direction.

9. The touch display screen according to claim 2, wherein:
a plurality of electrodes in the first direction are served collectively as one driving electrode which is adapted to be used when the touch detecting unit performs the touch detection, and a plurality of electrodes in the second direction are served collectively as one receiving electrode which is adapted to be used when the touch detecting unit performs the touch detection; or a plurality of electrodes in the first direction are served collectively as one receiving electrode which is adapted to be used when the touch detecting unit performs the touch detection, and a plurality of electrodes in the second direction are served collectively as one driving electrode which is adapted to be used when the touch detecting unit performs the touch detection.

10. The touch display screen according to claim 1, wherein the display electrode comprises a switch electrode, a pixel electrode, a Thin Film Transistor TFT, a signal electrode, a common electrode in an X-axis direction and a common electrode in a Y-axis direction, wherein:
a first insulating layer is stacked above the switch electrode, the TFT and the common electrode in the X-axis direction are stacked on the first insulating layer;
a second insulating layer is stacked above the TFT and the common electrode in the X-axis direction, the signal electrode and a drain are stacked on the second insulating layer, and the signal electrode and the drain are respectively connected to two terminals of the TFT by passing through the second insulating layer; and
a third insulating layer is stacked above the signal electrode and the drain, the pixel electrode is stacked on the third insulating layer, and the pixel electrode is connected to the drain by passing through the third insulating layer.

11. A touch display screen, comprising:
a touch detecting unit;
a display control unit; and
a display electrode comprising an electrode in a first direction and an electrode in a second direction which intersects with the first direction; and
wherein the electrode in the first direction and the electrode in the second direction are connected to the touch detecting unit,
the touch detecting unit is adapted to detect mutual capacitance formed between the electrode in the first direction and the electrode in the second direction, and determine a touch on the touch display screen based on the detected mutual capacitance; and
the electrode in the first direction and the electrode in the second direction are further connected to the display control unit, the display control unit is adapted to control the display electrode to perform image display; and
the display control unit and the touch detecting unit operate in a time-sharing manner.

12. The touch display screen according to claim 11, further comprising a control unit, which is connected to both the display control unit and the touch detecting unit for controlling the display control unit and the touch detecting unit to operate in the time-sharing manner.

13. The touch display screen according to claim 11, wherein:
the electrode in the first direction comprises a common electrode in an X-axis direction, and the electrode in the second direction comprises a signal electrode; or
the electrode in the first direction comprises a switch electrode, and the electrode in the second direction comprises a common electrode in a Y-axis direction; or
the electrode in the first direction comprises a common electrode in an X-axis direction, and the electrode in the second direction comprises a common electrode in a Y-axis direction.

14. The touch display screen according to claim 11, wherein:
a plurality of electrodes in the first direction are served collectively as one driving electrode which is adapted to be used when the touch detecting unit performs the touch detection, and a plurality of electrodes in the second direction are served collectively as one receiving electrode which is adapted to be used when the touch detecting unit performs the touch detection; or a plurality of electrodes in the first direction are served collectively as one receiving electrode which is adapted to be used when the touch detecting unit performs the touch detection, and a plurality of electrodes in the second direction are served collectively as one driving electrode which is adapted to be used when the touch detecting unit performs the touch detection.

15. The touch display screen according to claim 11, wherein the display electrode comprises a switch electrode, a pixel electrode, a Thin Film Transistor TFT, a signal electrode, a common electrode in an X-axis direction and a common electrode in a Y-axis direction, wherein:
a first insulating layer is stacked above the switch electrode, the TFT and the common electrode in the X-axis direction are stacked on the first insulating layer;
a second insulating layer is stacked above the TFT and the common electrode in the X-axis direction, the signal electrode and a drain are stacked on the second insulating layer, and the signal electrode and the drain are respectively connected to two terminals of the TFT by passing through the second insulating layer; and
a third insulating layer is stacked above the signal electrode and the drain, the pixel electrode is stacked on the third insulating layer, and the pixel electrode is connected to the drain by passing through the third insulating layer.

16. The touch display screen according to claim 1, wherein:
the display electrode operates for liquid crystal display and touch detecting in a time-sharing manner.

17. The touch display screen according to claim 5, wherein:
the display electrode operates for liquid crystal display and touch detecting in a time-sharing manner.

18. The touch display screen according to claim 11, wherein:
the display electrode operates for liquid crystal display and touch detecting in a time-sharing manner.

* * * * *